US008916396B2

(12) United States Patent
Chinone et al.

(10) Patent No.: US 8,916,396 B2
(45) Date of Patent: Dec. 23, 2014

(54) METHOD OF MANUFACTURING SEMICONDUCTOR ELEMENT

(71) Applicant: Stanley Electric Co., Ltd., Meguro-ku, Tokyo (JP)

(72) Inventors: Takako Chinone, Tokyo (JP); Mamoru Miyachi, Okegawa (JP); Tatsuma Saito, Yokohama (JP); Takanobu Akagi, Yokohama (JP)

(73) Assignee: Stanley Electric Co., Ltd., Tokyo (JP)

( * ) Notice: Subject to any disclaimer, the term of this patent is extended or adjusted under 35 U.S.C. 154(b) by 0 days.

(21) Appl. No.: 13/845,072

(22) Filed: Mar. 17, 2013

(65) Prior Publication Data
US 2013/0244361 A1 Sep. 19, 2013

(30) Foreign Application Priority Data

Mar. 19, 2012 (JP) .................................. 2012-061935

(51) Int. Cl.
*H01L 21/00* (2006.01)
*H01L 21/30* (2006.01)
(Continued)

(52) U.S. Cl.
CPC ................ *H01L 33/60* (2013.01); *H01L 24/29* (2013.01); *H01L 24/32* (2013.01); *H01L 24/83* (2013.01); *H01L 33/0079* (2013.01); *H01L 33/641* (2013.01); *H01L 2224/29111* (2013.01);
(Continued)

(58) Field of Classification Search
CPC ..... H01L 33/0079; H01L 33/60; H01L 33/40; H01L 33/20; H01L 24/29; H01L 2924/0105; H01L 2224/45144; H01L 2924/014; H01L 2224/13111; H01L 2924/01322; H01L 2224/13144; H01L 2224/05644; H01L 2224/81801
USPC .............. 438/22, 29, 46, 455; 257/13, 79, 80, 257/E33.066, E33.068; 156/60, 89.16, 156/89.28, 160; 228/111.5, 127, 155, 228
See application file for complete search history.

(56) References Cited

U.S. PATENT DOCUMENTS

| 7,535,092 | B2 | 5/2009 | Yokozuka |
| 8,158,459 | B2 | 4/2012 | Seko |
| 8,288,868 | B2 | 10/2012 | Seko |
| 8,405,113 | B2 * | 3/2013 | Kazama ........................ 257/98 |
| 2005/0199904 | A1 * | 9/2005 | Yamamoto .................... 257/103 |

(Continued)

FOREIGN PATENT DOCUMENTS

JP 2006-237419 A 9/2006

OTHER PUBLICATIONS

Related U.S. Appl. No. 13/845,078; First Named Inventor: Takako Chinone; Title: "Semiconductor Element and Method of Manufacturing Same"; filed Mar. 17.

*Primary Examiner* — Hsien Ming Lee
(74) *Attorney, Agent, or Firm* — Holtz, Holtz, Goodman & Chick PC

(57) ABSTRACT

A method of manufacturing a semiconductor element includes forming an element structure layer having a semiconductor layer, on a first substrate. The method also includes forming a first bonding layer on the element structure layer. The method also includes forming a second bonding layer on a second substrate. The method also includes performing heating pressure-bonding on the first and second bonding layers, with the first and second bonding layers facing each other. One of the first bonding layer and the second bonding layer is an AU layer, and the other is an AuSn layer. The AuSn layer has a surface layer having an Sn content of between 85 wt % (inclusive) and 95 wt % (inclusive).

15 Claims, 5 Drawing Sheets

(51) Int. Cl.
*H01L 27/15* (2006.01)
*H01L 33/60* (2010.01)
*H01L 23/00* (2006.01)
*H01L 33/00* (2010.01)
*H01L 33/64* (2010.01)
*H01L 23/373* (2006.01)
*H01L 33/40* (2010.01)

(52) U.S. Cl.
CPC .............. *H01L 2224/29144* (2013.01); *H01L 2224/83193* (2013.01); *H01L 2224/83203* (2013.01); *H01L 2224/83805* (2013.01); *H01L 2924/013* (2013.01); *H01L 23/3735* (2013.01); *H01L 33/405* (2013.01); *H01L 2933/0075* (2013.01); *H01L 2924/01322* (2013.01)
USPC .................. 438/22; 438/29; 438/455; 257/79

(56) References Cited

U.S. PATENT DOCUMENTS

| | | | |
|---|---|---|---|
| 2008/0135868 A1* | 6/2008 | Okagawa et al. | 257/99 |
| 2011/0042708 A1* | 2/2011 | Nihei et al. | 257/99 |
| 2011/0315315 A1* | 12/2011 | Garnier | 156/285 |
| 2012/0025251 A1* | 2/2012 | Kazama | 257/98 |
| 2012/0070958 A1 | 3/2012 | Furukawa et al. | |

\* cited by examiner

METHOD OF MANUFACTURING SEMICONDUCTOR ELEMENT

BACKGROUND OF THE INVENTION

1. Field of the Invention

The present invention relates to a method of manufacturing a semiconductor element, and in particular a method of manufacturing a light-emitting diode (LED).

2. Description of the Related Art

Light-emitting devices equipped with LED elements are used in, for example, illumination, backlighting and industrial equipment. Efforts are expended to increase the brightness of light-emitting elements in such light-emitting devices. LED elements are manufactured by using, for example, a metal-organic chemical vapor deposition (MOCVD) method to deposit a semiconductor layer of AlGaInP or GaN by epitaxial growth on a GaAs substrate, sapphire substrate or other suitable growth substrates. In an LED element manufactured in this way, light emitted from the light emission layer is absorbed in the growth substrate so that the efficiency of light extraction is reduced. In addition, the efficiency of heat dissipation is poor because of the low thermal conductivity of the growth substrate.

In order to resolve the above-mentioned problems, LED elements are manufactured in the following manner: a semiconductor layer grown on a growth substrate is laminated on a supporting substrate that has high thermal conductivity with a light-reflecting material intervening, and then the growth substrate is removed. Such LED elements are disclosed, for example, in Japanese Patent Application Publication (Kokai) No. 2006-237419.

When semiconductor elements are manufactured using supporting substrates as described above, a eutectic crystal such as AuSn or InAu is used to bond the semiconductor layer to a supporting substrate with high thermal conductivity. This bonding is referred to as "eutectic bonding" in this specification. In eutectic bonding, the eutectic crystal material must be melted or softened at a high temperature (280° C. or above) in order to perform satisfactory bonding with few voids in the bond portion. Further, if there are irregularities in the temperature over the wafer surface, irregularities occur in the melting or softening, and large voids measuring several microns or more occur in the bond portion. Moreover, because treatment must be performed at high temperature, warping of the wafer during bonding due to a difference in the thermal expansion coefficients of the semiconductor layer and the thermally conductive supporting substrate may occur, and destruction of the wafer during subsequent laser liftoff (LLO) of the growth substrate may occur. These result in reduced manufacturing yields and reduced reliability of light-emitting elements manufactured by eutectic bonding.

SUMMARY OF THE INVENTION

One object of this invention is to provide a method of manufacturing a semiconductor element, such as LED, with excellent productivity, manufacturing yields and reliability. The semiconductor element has a thermally conductive supporting substrate. In bonding a semiconductor wafer to the supporting substrate, the present invention achieves uniform joining of the semiconductor wafer and the supporting substrate at low temperature and with few voids. Also, the invention prevents warping and/or destruction of the semiconductor wafer and supporting substrate due to the bonding treatment and/or subsequent growth substrate removal.

According to one aspect of the present invention, there is provided a method of manufacturing a semiconductor element that includes preparing a first substrate, and forming an element structure layer having a semiconductor layer, on the first substrate. The method also includes forming a first bonding layer on the element structure layer to provide a first laminated body (or semiconductor wafer). The method also includes preparing a second substrate, and forming a second bonding layer on the second substrate to provide a second laminated body. The method also includes performing heating pressure-bonding on the first and second laminated bodies, with the first and second bonding layers facing each other, to provide a combined semiconductor element. One of the first bonding layer and the second bonding layer is a layer comprising Au (AU layer), and the other is a layer comprising AuSn (AuSn layer). The AuSn layer has a surface layer having an Sn content in the range of between 85 wt % (inclusive) and 95 wt % (inclusive).

By this method of manufacturing a semiconductor element, bonding (or joining) of the semiconductor wafer to the supporting substrate is made at low temperature with few voids. Also, the occurrence of warping or destruction after bonding of the semiconductor wafer and supporting substrate can be prevented. Accordingly the productivity one reliability of semiconductor elements can be improved.

These and other objects, aspects and advantages of the present invention will become apparent to those skilled in the art from the following detailed description and claims, when read and understood in conjunction with the accompanying drawings.

DETAILED DESCRIPTION OF THE INVENTION

Embodiment 1

Figure 1A:
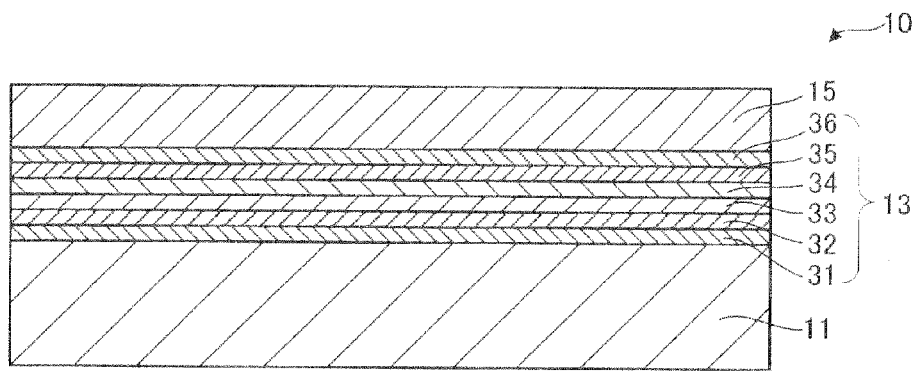
FIG. 1A is a cross-sectional view of a semiconductor wafer that is to be bonded in the manufacturing method of Embodiment 1 of the invention.
Figure 3:
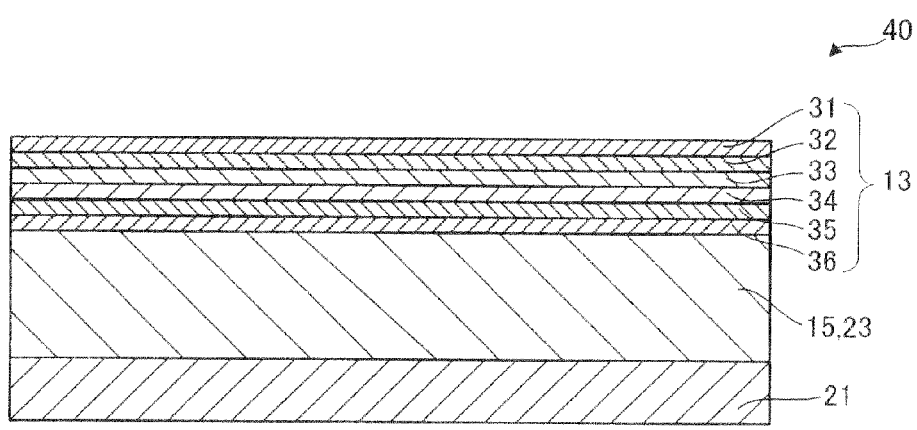
FIG. 3 illustrates a cross-sectional view of a light-emitting element manufactured using the manufacturing method of Embodiment 1.

A method of manufacturing a light-emitting element according to Embodiment 1 of the invention is described below, referring to FIG. 1A, FIG. 1B, FIG. 2 and FIG. 3. FIG. 1A shows a semiconductor water 10 that is to be bonded to a supporting structure 20 shown in FIG. 1B by the method of manufacturing the light-emitting element 40 of Embodiment 1. FIG. 3 illustrates a resulting light-emitting element 40. FIG. 2 is an Au—Sn alloy state diagram.

As shown in FIG. 1A, the semiconductor wafer 10 includes a growth substrate 11, an element structure layer (device layer) 13 grown on the growth substrate 11, and a first bonding layer 15 formed on the upper face of the element structure layer 13.

Firstly, the growth method of the element structure layer 13 is described. For example, an MOCVD method is used in epitaxial growth, on the (001) face of a sapphire substrate 11 of thickness 430 μm and diameter 2 inches, with the growth temperature between approximately 500° C. and 1100° C. according to the layer being grown, of a GaN layer of layer thickness 5.0 μm as an n-type cladding layer 31, a light-emitting layer 32 of layer thickness 75 nm, a p-type barrier layer 33 of composition $Al_{0.2}Ga_{0.8}N$ and layer thickness 40 nm, and a GaN layer of layer thickness 100 nm as a p-type cladding layer 34, to form a semiconductor layer. These layers are grown in turn. The light-emitting layer may be a multiple quantum well (MQW), single quantum well (SQW), or single layer (so-called bulk layer).

A multiple quantum well structure has for example five pairs of well layers and barrier layers, with $In_xGa_{1-x}N$ layers (composition variable x=0.35, thickness 2 nm) as the well layers and GaN layers (thickness 14 nm) as the barrier layers. The In composition variable x of the well layers is adjusted in the range $0 \leq x \leq 1.0$ according to the light emission wavelength.

Next, a reflective electrode layer 35 comprising Ni and Ag is formed on the p cladding layer 34. The reflective electrode layer 35 is formed by deposition of 0.5 nm Ni and 300 nm AG in succession on the p-type cladding layer 34, for example, using an EB (electron beam or e-beam) evaporation deposition method. It should be noted that other methods than the EB evaporation deposition method may be used; for example, a resistive heating evaporation deposition method or sputtering method may be used.

Next, a resist mask is formed on the surface of the reflective electrode layer 35 in the region which is to became the light-emitting region. Using an etchant mixed in the ratio of nitric acid 1:water 1:acetic acid 8:phosphoric acid 10, etching was performed for 20 seconds at 25° C. After the etching, heat treatment was performed for 2 minutes at 400° C. in an atmosphere containing oxygen.

Finally, in order to prevent diffusion of the Ag from the Ag reflective electrode layer 35, an EB evaporation deposition method is used to form in succession a Ti layer 100 nm thick and a Pt layer 200 nm thick on the reflective electrode layer 35. The Ti layer and Pt layer in combination serve as a diffusion prevention barrier layer 36.

The entirety of the semiconductor structure layer having the p-type semiconductor layer, n-type semiconductor layer, light-emitting layer and other layers, and/or the semiconductor structure layer with an electrode, insulating layer, reflective layer or other device elements added, is called an element structure layer or a device layer in this embodiment.

The first bonding layer 15 is formed on the element structure layer 13. The first bonding layer 15 is a layer to be used in eutectic bonding with the supporting structure 20 (will be described). The first bonding layer 15 is formed by using an EB evaporation deposition method to deposit 200 nm of Au. In the eutectic bonding, it is preferable that the surface of the first bonding layer 15 be flat, and thus it is preferable that the layer thickness of the Au layer be 50 nm or greater so as to absorb roughness in the surface of the element structure layer 13.

Figure 1B:
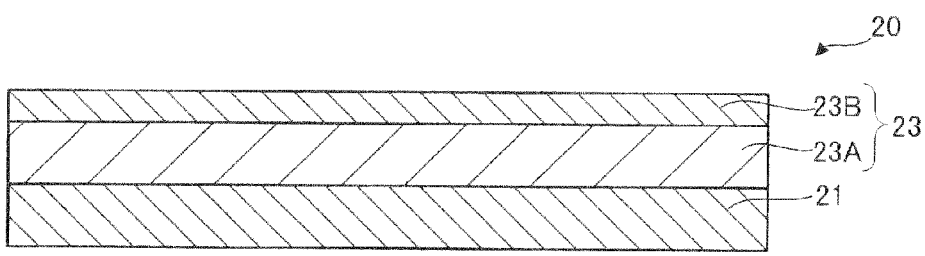
FIG. 1B is a cross-sectional view of a supporting structure that is to be bonded to the semiconductor wafer of FIG. 1A in the manufacturing method of Embodiment 1.
Figure 2:
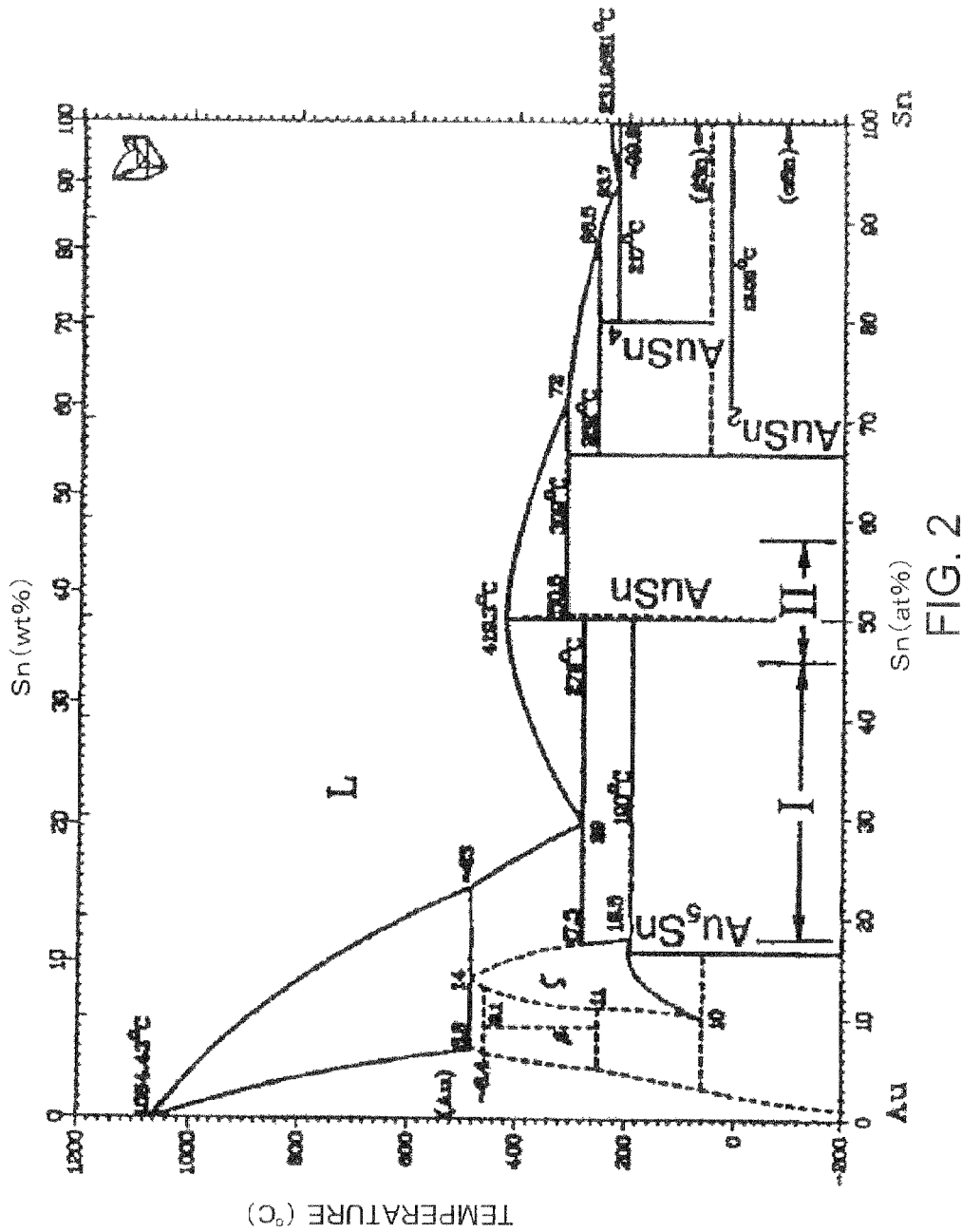
FIG. 2 shows a state diagram of an Au—Sn system alloy.

As shown in FIG. 1B, the supporting structure 20 has a supporting substrate 21, and a second bonding layer 23 formed on the supporting substrate 21.

The supporting substrate 21 has a substrate of Si with high thermal conductivity, and an Ohmic metal layer (not shown) formed on the surface of the Si substrate. The Ohmic metal layer is made by evaporation deposition or other suitable methods, in succession, of 200 nm Pt, 150 nm Ti, 50 nm Ni, 100 nm Au, and 200 nm Pt. It should be noted that the supporting substrate 21 may be made from another material, such as Ge, Al or Cu, so long as the thermal conductivity is high.

The second bonding layer 23 has an underlayer 23A and a surface layer 23B. The underlayer 23A is formed by evaporation deposition on the supporting substrate 21 of AuSn containing 25 wt % Sn to 500 nm by codeposition using a resistive heater. The surface layer 23B is formed by evaporation deposition onto the underlayer 23A of AuSn to 100 nm, by codeposition using the resistive heater. Use of the codeposition and resistive heater for the surface layer 23B is similar to the underlayer 23A.

The surface layer 23B has an AuSn composition containing a large amount of Sn (a so-called Sn-rich composition). In this embodiment, the surface layer 23B has, for example, a composition with an Sn content of 90 wt %. By increasing the malleability and ductility of the surface layer 23B, the adhesiveness of the bonding face in bonding (will be described) is increased, and the melting temperature of the surface layer 23B is lowered, facilitating the eutectic bonding reaction at low temperatures during bonding. FIG. 2 shows an Au—Sn alloy state diagram (phase diagram). The source of this state diagram is "Spontaneous alloying in nanoparticles (applications to materials science, Hamiltonian mechanical systems and chaos, research group report)" Bussei Kenkyu, 70(4), 541-545, 1998-07-20, Bussei Kenkyu Kankoukai. Referring to FIG. 2, it is seen that AuSn containing 90 wt % Sn begins melting at approximately 220° C. In order to improve adhesion with the first bonding layer in the bonding process (will be described), it is preferable that the surface of the second bonding layer 23, that is, the surface of the surface layer 23B, be flat, and thus it is preferable that the layer thickness of the second bonding layer 23, combining the underlayer 23A and the surface layer 23B, be 50 nm or greater in order to absorb roughness in the supporting substrate surface.

The semiconductor wafer 10 and supporting structure 20 formed as described above are bonded together, with the first bonding layer 15 and second bonding layer 23 intervening or facing. Subsequently, the growth substrate 11 is removed to obtain the semiconductor element 40 shown in FIG. 3.

Figure 4A:
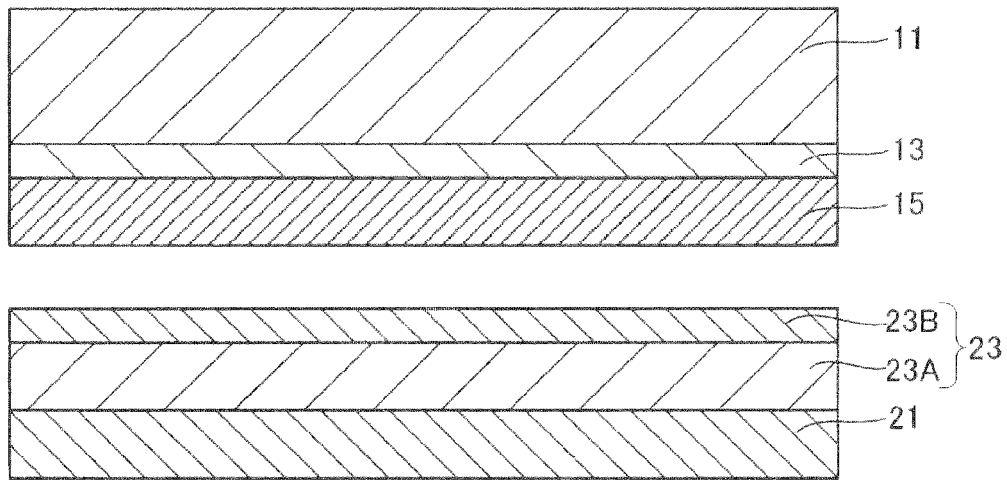
FIG. 4A is a cross-sectional view of parts of a light-emitting element that are used in the manufacturing method of Embodiment 1.
Figure 4B:
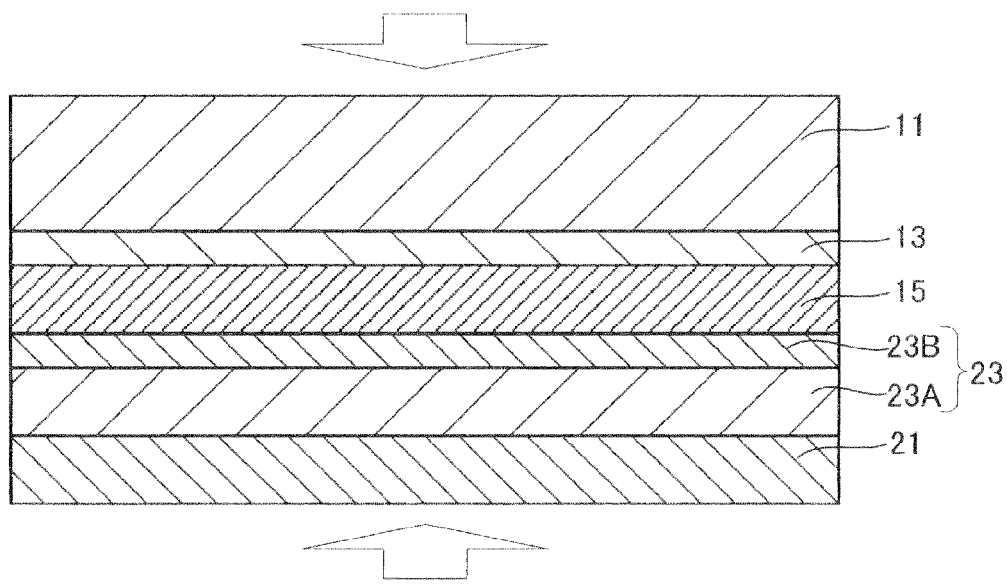
FIG. 4B is a cross-sectional view of parts of the light-emitting element that are used in the manufacturing method of Embodiment 1.
Figure 4C:
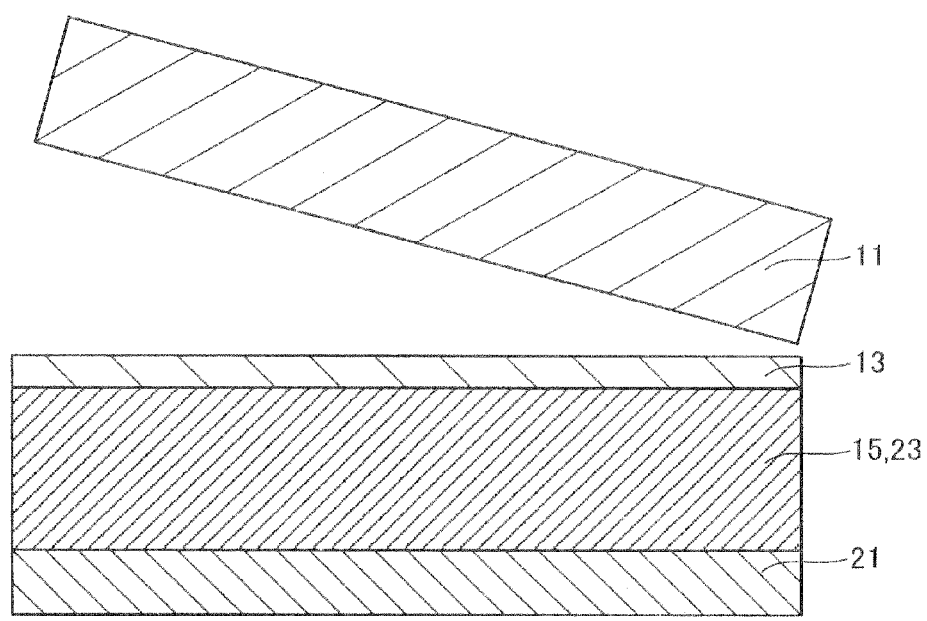
FIG. 4C is a cross-sectional view of parts of the light-emitting element that are used in the manufacturing method of Embodiment 1.
Figure 5:
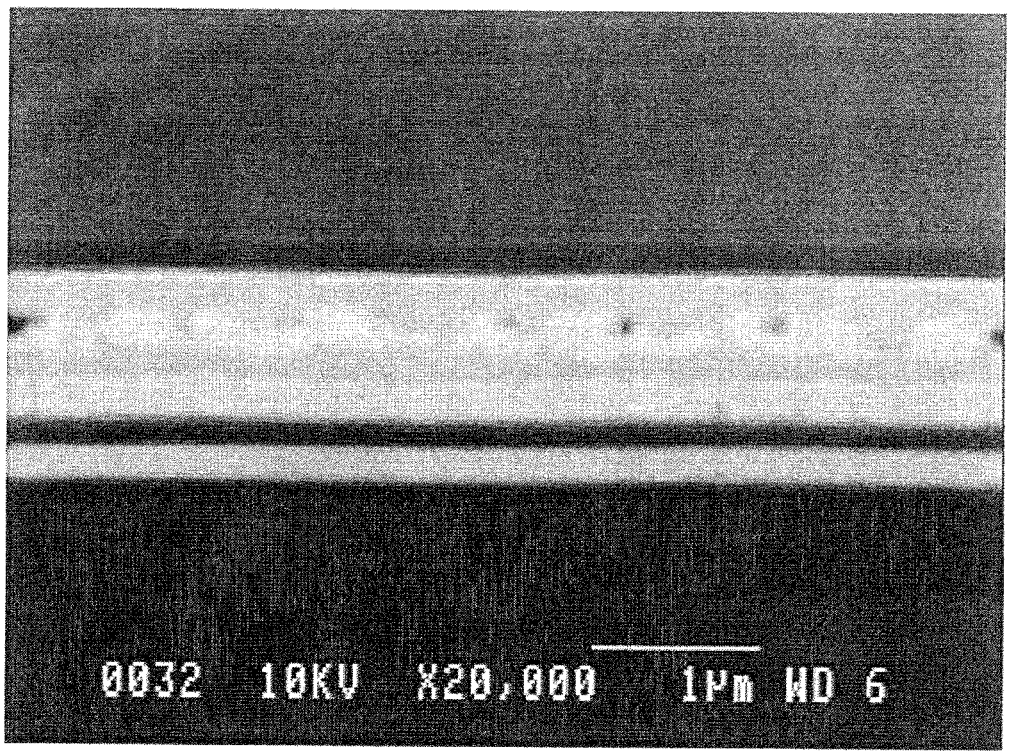
FIG. 5 is an SEM image showing a cross-sectional view of the bonding portion that is created by a process of heating pressure-bonding according to the manufacturing method of Embodiment 1.

Referring now to FIG. 4A to FIG. 4C and FIG. 5, the method of bonding together the semiconductor wafer 10 and supporting structure 20 to manufacture the semiconductor element 10 is described. FIG. 4A to FIG. 4C is a series of cross-sectional views that illustrate three steps in the method of manufacturing the light-emitting element 40. FIG. 5 is a scanning electron microscopy (SEM) image (20,000×) of a cross section of the bonding portion after the semiconductor wafer 10 and the supporting structure 20 have been bonded. It should be noted that in FIG. 4A to FIG. 4C, the detail of the layer structure within the element structure layer 13 is omitted.

First, as shown in FIG. 4A, the semiconductor wafer 10 and supporting structure 20 are prepared and disposed such that the respective bonding layers 15 and 23 oppose each other. Next, as shown in FIG. 4B, the semiconductor wafer 10 and supporting structure 20 are heated to 250° C. in a vacuum environment, the surface of the first bonding layer 15 and the surface of the second bonding layer 23 are brought into contact, and a force of 6 kN (N: Newtons) is applied in opposite directions (indicated by the unshaded arrows) and maintained for 30 minutes, to perform pressure-bonding.

During this bonding, because the surface layer 23B is of a composition containing an extremely large amount of Sn and thus has high malleability and ductility, the surface of the surface layer 23B and the surface of the first bonding layer 15 of the semiconductor wafer 10 adhere due to pressure. Because the surface layer 23B melts at the low temperature of approximately 220° C. and the Sn concentration gradient is large between the surface layer 23B and the first bonding layer 15, mass diffusion including solid state diffusion occurs extremely vigorously even at low temperatures at the interface between the surface layer 23B and the first bonding layer 15. Accordingly, bonding of the surface layer 23B and first bonding layer 15 at low temperatures with few voids is achieved. As a result of performing pressure-bonding treatment under the above-described conditions, the warping of the semiconductor wafer 10 and supporting structure 20 was approximately 25 μm. This value is less than the upper limit values for satisfactory manufacturing, namely 30 to 40 μm, for which manufacturing yields are generally good without the occurrence of cracking or other defects in the semiconductor wafer 10 and/or supporting structure 20, when manufacturing the light-emitting element 40.

It should be noted that this pressure-bonding treatment may be performed in a nitrogen atmosphere. It should be also noted that the pressure-bonding treatment may be performed at a temperature below the melting point of the first bonding layer and underlayer, for example 220° C. to 250° C., so that warping of the semiconductor wafer 10 and supporting structure 20 does not become large after heating to perform the bonding. It is preferable that bonding be performed at 230° C. to 250° C. because voids occurring in the bonding layers 15 and 23 are comparatively scarce. The heating time is between 10 minutes and 60 minutes, depending as the heating temperature, and preferably is 30 minutes or shorter in order to prevent degradation of the element structure and/or other parts of the semiconductor element 40.

It is desirable that high force (or high pressure) be applied during the heating pressure-bonding in order to provide (achieve) sufficient adhesion of the surface of the bonding layer 15 with the surface of the surface layer 23B, but in order to prevent damage to the semiconductor wafer 10 and supporting structure 20, a force to be applied during the pressure-bonding is preferably in the range from 2.5 kN to 12 kN.

FIG. 5 shows a SEM image of a bonding portion cross section after the pressure-bonding treatment. As is seen from FIG. 5, the first bonding layer and the second bonding layer fuse due to interdiffusion, including solid state diffusion or liquid state diffusion, to become a single bonding portion, and the resulting "single bonding portion" has become an AuSn layer (or part) with an Sn content in the range of approximately from 15 to 25 wt %. Referring to the Au—Sn system alloy state diagram of FIG. 2, for example the melting temperature of AuSn containing approximately 20 wt % Sn is approximately 280° C., and it is seen that a bonding portion which can withstand the electrode formation process (will be described) and other high-temperature treatment has been formed.

After bonding the semiconductor wafer 10 to the supporting structure 20, the growth substrate 11 is removed as shown in FIG. 4C by for example using a laser liftoff (LLO) device that irradiates the growth substrate 11 from the rear-face side with an excimer laser, to complete the manufacturing of the light-emitting element 40. It should be noted that the method of removing the growth substrate 11 is not limited to the laser liftoff (LLO) method. For example, wet etching, dry etching, mechanical polishing, chemical-mechanical polishing (CMP), or any combination of two or more of these methods may be used.

The process after removal of the growth substrate 11 by LLO is described. After removing the growth substrate 11 the Ga generated by LLO is removed using hot water or other suitable agents, and the exposed surface resulting after removal of the substrate 11 is subjected to surface treatment using hydrochloric acid. The reagent used in surface treatment after LLO may be any material which can etch a nitride semiconductor. For example, an acid or alkaline solution including phosphoric acid, sulfuric acid, KOH or NaOH may be used. The surface treatment may be performed by dry etching using an Ar plasma or chlorine system plasma, by polishing, or by other suitable methods.

After the above-described surface treatment, an Ohmic electrode, that is, an n electrode (not shown) is formed on the light extraction fact side. Specifically, the n electrode is formed on the n-type cladding layer on the surface of the device layer 13 exposed by removal of the growth substrate, for an Ohmic junction with the n-type cladding layer. The n electrode is formed by depositing by evaporation deposition or other suitable methods, in order, Ti 1 nm, Al 200 nm, Ti 100 nm, Pt 200 nm and Au 1000 nm. It should be noted that the n electrode may be made from other materials which can form an Ohmic junction with an n-type semiconductor. For example, such materials include Al and Rh, or Al and Pt.

The Ohmic electrode may for example be formed using a lift-off method. The evaporation deposition method includes a resistive heating evaporation deposition method, an EB evaporation deposition method, or sputtering method. In order to form a satisfactory Ohmic junction between an n-type cladding layer and an Ohmic electrode on the light extraction face side, alloying by heat treatment at approximately 400° C. in an nitrogen atmosphere may be performed. After passing through the above-described processes, the light-emitting element 40 is obtained.

In the method of manufacturing the light-emitting element 40 according to Embodiment 1, the surface layer 23B of the second bonding layer 23 on the side of the supporting structure 20 is formed from AuSn with an Sn content of 90 wt %, with a low melting point. Therefore, during the bonding of the semiconductor wafer 10 with the supporting structure 20, no treatment is performed at so high temperature, that would otherwise cause warping sufficient to destroy the device layer 13. At the same time, a strong bond with few voids can be formed between the first bonding layer 15 and the second bonding layer 23. Even when materials not resistant to high temperatures are used in the element structure layer and other layers, strong bonding can be achieved without causing degradation of the layers (or the materials in the layers). Hence manufacturing yields of semiconductor elements 40 can be increased and the quality of the semiconductor elements 40 can be improved.

After the bonding of the semiconductor wafer 10 and the supporting structure 20, the surface layer 23B having a low melting point fuses with the first bonding layer 15 and the underlayer 23A to become a single bonding portion, and overall an AuSn layer with a lower Sn ratio (in this embodiment, 15 to 25 wt %) than the Sn ratio of the surface layer 23B is formed. Hence as is seen from the alloy state diagram of FIG. 2, the bonding portion formed by eutectic bonding of the first bonding layer 15 and the second bonding layer 23 becomes a layer having a certain melting point (in this embodiment, approximately 280° C. or higher) which can withstand high-temperature treatment following bonding, such as electrode formation treatment.

The above-described embodiment deals with a light-emitting element, but the manufacturing method of this invention can be applied to the manufacture of other electronic devices as well.

In the illustrated embodiment, a 200 nm Au layer was formed as the first bonding layer on the semiconductor wafer side, an AuSn layer with an Sn content of 25% was formed as the underlayer of the second bonding layer, and the Sn content of the entirety of the bonding portion was approximately 15 to 25 wt %. The present invention is not limited in this regard. For example, various modifications may be made within the range in which the first bonding layer and the second bonding layer form a bonding portion with few voids and satisfactory bonding strength at low temperature (250° C. or lower). For instance, while securing a sufficient concentration gradient between the first bonding layer 15 or underlayer 23A and the surface layer 23B, the first bonding layer 15 may be an AuSn layer having a low Sn content (10 wt % or lower) rather than a pure Au layer, the Sn content of the underlayer 23B may be altered, or the layer thicknesses of the respective layers may be changed, to change the Sn ratio of the entirety of the bonding portion from the 15-25 wt % range. In a case where the Sn content of the entirety of the bonding portion is made 30 wt %, the melting point is approximately 400° C., and so still higher resistance to heat treatment after bonding can be imparted.

If the Sn ratio in the AuSn of the entirety of the bonding layer after bonding is made approximately 65 wt % or lower, the melting point of the bonding portion becomes 280° C. or higher, and satisfactory resistance to heat treatment, such as in electrode formation after bonding, can be imparted.

In the above-described embodiment, the second bonding layer 23 has a two-layer structure that includes the underlayer 23A and the Sn-rich surface layer 23B. The present invention is not limited in this regard. For example, in order to alter the Sn content of the bonding portion after bonding, the underlayer 23A may have a multi-layer structure (including two or more layers) with different Sn compositions. In other words, the second bonding layer 23 may have two or more underlayers 23A.

In the above-described embodiment, the first bonding layer 15 on the semiconductor wafer side is an Au layer, and the second bonding layer 23 on the supporting structure side is a combination of the underlayer 23A and the Sn-rich surface layer 23B. The present invention is not limited in this regard. For example, the first bonding layer 15 on the semiconductor wafer side may be a combination of the underlayer and the Sn-rich surface layer, and the second bonding layer 23 on the supporting structure side way be an Au layer.

In the above-described embodiment, the GaN semiconductor layer is formed on the sapphire substrate. Alternatively, an AlGaInP semiconductor layer may be formed on a GaAs substrate. In this configuration, the growth substrate may be removed by for example wet etching using an etchant which is a mixture of ammonia and hydrogen peroxide, or by dry etching, mechanical polishing, or chemical-mechanical polishing (CMP).

The various numerical values, dimensions, materials and similar in the above-described embodiment are merely exemplifications, and should be selected appropriately according to the application, the semiconductor element to be manufactured, and/or other conditions.

This application is based on Japanese Patent Application No. 2012-61935 filed on Mar. 19, 2012, and the entire disclosure thereof is herein incorporated by reference.

What is claimed is:

1. A method of manufacturing a semiconductor element, comprising:
    forming an element structure layer including a semiconductor layer, on a first substrate;
    forming a first bonding layer on the element structure layer to provide a first laminated body;
    forming a second bonding layer on a second substrate to provide a second laminated body; and
    performing heating pressure-bonding on the first and second laminated bodies, with the first and second bonding layers facing each other, to provide a combined semiconductor element having a bonding portion that is made by said heating pressure-bonding of the first and second laminated bodies,
    wherein one of the first bonding layer and the second bonding layer is a layer of Au, the other is a layer comprising AuSn, and the layer comprising AuSn comprises a surface layer and an underlayer, said surface layer having a Sn content in a range of between 85 wt % and 95 wt %, and sais underlayer comprising AuSn and having a Sn content lower than the Sn content of said surface layer; and
    wherein said heating pressure-bonding is performed at a temperature equal to or below a melting point of Au and the underlayer.

2. The method of manufacturing a semiconductor element according to claim 1, wherein said heating pressure-bonding includes heating the first bonding layer and the second bonding layer to a temperature of between 220° C. and 250° C.

3. The method of manufacturing a semiconductor element according to claim 1, wherein the Sn content of the layer comprising AuSn is determined such that a Sn content of the bonding portion is 65 wt % or lower.

4. The method of manufacturing a semiconductor element according to claim 1, wherein the Sn content of the layer comprising AuSn is determined such that the Sn content of the bonding portion is between 15 wt % and 25 wt %.

5. The method of manufacturing a semiconductor element according to claim 1, wherein said heating pressure-bonding causes the first and second bonding layers to fuse due to interdiffusion, including solid state diffusion or liquid state diffusion, to become the bonding portion.

6. The method of manufacturing a semiconductor element according to claim 1, further comprising forming a reflective electrode layer on the element structure layer prior to said forming the first bonding layer on the element structure layer.

7. The method of manufacturing a semiconductor element according to claim 6 further comprising forming a diffusion prevention barrier layer on the reflective electrode layer prior to said forming the first bonding layer on the element structure layer.

8. The method of manufacturing a semiconductor element according to claim 1, wherein said forming the first bonding layer includes depositing An by electron beam vapor deposition method.

9. The method of manufacturing a semiconductor element according to claim 1, wherein the underlayer is an AuSn layer having a thickness of 500 nm, and the surface layer is another AuSn layer having a thickness of 100 nm.

10. The method of manufacturing a semiconductor element according to claim 9, wherein the surface layer contains Sn 90 wt %.

11. The method of manufacturing a semiconductor element according to claim 1, wherein said heating pressure-bonding is carried out in a vacuum environment or a nitrogen atmosphere, with a force of between 2.5 kN and 12 kN being applied to the first and second laminated bodes in opposite directions.

12. The method of manufacturing a semiconductor element according to claim 1, wherein the surface layer has a melting point of about 220° C.

13. The method or manufacturing a semiconductor element according to claim 1, wherein said heating pressure-bonding is carried out at a temperature of between 230° C. and 250° C. for a period of between 10 minutes and 60 minutes.

14. The method of manufacturing a semiconductor element according to claim 1, wherein said heating pressure-bonding is carried out at a temperature of between 230° C. and 250° C. for a period of between 10 minutes and 30 minutes.

15. A method of manufacturing a semiconductor element, comprising:

forming an element structure layer including a semiconductor layer, on a first substrate;

forming a first bonding layer on the element structure layer to provide a first laminated body;

forming a second bonding layer on a second substrate to provide a second laminated body; and performing heating pressure-bonding on the first and second laminated bodies, with the first and second bonding layers facing each other, to provide a combined semiconductor element having a bonding portion that is made by said heating pressure-bonding of the first and second laminated bodies;

wherein the first bonding layer is a layer of Au, the second bonding layer is a layer comprising AuSn, and the second bonding layer has a two-layer structure that includes a surface layer and an underlayer, said surface layer having a thickness of 100nm and having a Sn content in a range of between 85 wt % and 95 wt %, and said underlayer being a AuSn layer and having a thickness of 500 nm.

* * * * *